United States Patent [19]

Ohuchi

[11] Patent Number: 4,502,008
[45] Date of Patent: Feb. 26, 1985

[54] METHOD AND APPARATUS FOR NUCLEAR MAGNETIC RESONANCE SPECTROSCOPY

[75] Inventor: Muneki Ohuchi, Tokyo, Japan
[73] Assignee: JEOL Ltd., Tokyo, Japan
[21] Appl. No.: 465,324
[22] Filed: Feb. 9, 1983

[30] Foreign Application Priority Data

Feb. 19, 1982 [JP] Japan ................................ 57-25492

[51] Int. Cl.³ .......................................... G01R 33/08
[52] U.S. Cl. .................................... 324/311; 324/307
[58] Field of Search ............... 324/300, 307, 308, 311, 324/312, 313, 314, 317

[56] References Cited

U.S. PATENT DOCUMENTS 4,068,161   1/1978   Ernst .................................. 324/311

OTHER PUBLICATIONS

R. Freeman et al., "Composite Pulse Decoupling" *Journal of Magnetic Resonance*, 43, pp. 502–507 (1981).

Primary Examiner—Michael J. Tokar
Attorney, Agent, or Firm—Webb, Burden, Robinson & Webb

[57] ABSTRACT

A method and apparatus for nuclear magnetic resonance spectroscopy is disclosed which expands the decoupling bandwidth. In the method, a pulse train containing a series of radiofrequency pulses joined without interval is applied repeatedly to a sample, each radiofrequency pulse being phased at 0°, 90°, 180°, or 270°, and the radiofrequency carrier of the pulse train is reversed in phase at the interval longer than the repetitive cycle of the pulse train asynchronously with the repetition of application of the pulse train.

5 Claims, 7 Drawing Figures

METHOD AND APPARATUS FOR NUCLEAR MAGNETIC RESONANCE SPECTROSCOPY

BACKGROUND OF THE INVENTION

This invention relates to a method and apparatus for nuclear magnetic resonance spectroscopy, and more particularly to a method and apparatus for expanding the decoupling bandwidth.

In nuclear magnetic resonance spectroscopy, spin decoupling technique is used for identifying or simplifying a spectrum split by spin-spin coupling and further for improving sensitivities. Generally, spin decoupling is worked out by putting the unobserved nuclear species coupled with the observed nuclear species in a resonant state, and decoupling the spin-spin coupling, and basically, requires application of a radiofrequency magnetic field having the resonant frequency for the unobserved nuclear species. However, application of a continuous wave radiofrequency field may result in a narrow decoupling bandwidth. Then, for broadening the decoupling bandwidth, a noise modulation method in which the rf field is modulated by random or pseudorandom noise or a square wave phase modulation method in which rf field is phase-modulated by square wave (that is to say, rf field is reversed in phase at a constant period) is used. Nevertheless, neither of the methods can sufficiently broaden the decoupling bandwidth.

FIG. 1 shows the decoupling bandwidth according to each modulation method, where (a) refers to continuous irradiation without modulation; (b) refers to a case of noise modulation with a 1,000 Hz bandwidth; and (c) refers to a case of square wave phase modulation by 100 Hz square wave. For the comparison in FIG. 1, the nuclear species to be decoupled are protons and the resonant frequency (central frequency: 0 Hz off-set) is 100 MHz, and the peak power at (a) is normalized to 1.0.

Assuming that the marginal power at which decoupling is effective is approximately 0.5, it can be shown that the decoupling bandwidth in either case (b) or (c) can ultimately cover only about 1 KHz equivalent to the chemical shift width of protons at 100 MHz.

For broadening the decoupling bandwidth, it is necessary to increase rf power (electric power). There exist limitations upon increasing the rf power due to heating of the sample and the irradiation coil.

In recently developed NMR spectrometers having superconducting magnets, since intensity of static magnetic field is extremely high, the resonant frequency can reach 400 MHz or 500 MHz (each for protons) and it is necessary to expand the decoupling bandwidth correspondingly. The above referenced prior decoupling methods are unsatisfactory for this reason.

More recently, the following pulse decoupling method has been proposed by R. Freeman (Journal of Magnetic Resonance, 43 502, 1981).

As shown in FIG. 2, in this pulse decoupling method, a pulse train which consists of 90° pulses (rf pulses having pulse width for rotating the magnetization by 90°) for the species to be decoupled and 240° pulses (rf pulses having pulse width for rotating the magnetization by 240°) without intervals, is applied repeatedly. In FIG. 2, suffixes x, y, −x and −y indicate the phase of rf carrier in each pulse as follows: x: 0°; y: 90°; −x: 180°; and −y: 270°. In FIG. 3, (d) represents the decoupling bandwidth obtained by the repeated irradiation of this pulse train. It can be found out from the figure that the bandwidth becomes more than several times as broad as those obtained by any of the modulation methods shown in FIG. 1. In addition, since the peak strength also becomes higher than those obtained by the conventional decoupling methods, decoupling can be effectively complete over a wide range and the signal to noise ratio is improved.

This pulse decoupling method has been further advanced in the present invention. Namely, the present inventor has calculated the relations between the off-set frequency and $J_R/J_0$ in the aforementioned pulse decoupling method under appropriate conditions. (The off-set frequency is the difference in frequency between the resonant frequency of the observed species and the resonant frequency of the species to be decoupled.) $J_0$ represents a distance between two peaks split by coupling and $J_R$ represents a distance between two peaks reduced by decoupling. The degree of decoupling can be known by the value of $J_R/J_0$, thereby peaks are completely unified when $J_R/J_0=0$ (in other words, a state of complete decoupling).

For instance, calculations can be done as follows. Assuming that I and S represent the spin systems of two nuclear species, and that rf field for decoupling (intensity: $H_2$, angular frequency $\omega_2$) is applied to S spins, the spin Hamiltonian $\mathcal{H}$ is given for a function of time t as follows:

$$\mathcal{H} = -[\omega_I I_z + \omega_S S_z - 2\pi J_0 \mathbf{I} \cdot \mathbf{S} + \gamma_I H_2(I_x \cos\omega_2 t - I_y \sin \omega_2 t) + \gamma_S H_2(S_x \cos \omega_2 t - S_y \sin \omega_2 t)]$$

Where, $\omega_I$, $\omega_S$ are angular frequencies of I and S spin systems; $I_X$, $I_Y$, and $I_Z$ are X, Y, Z direction components of the magnetization of the I spin system, $S_X$, $S_Y$, $S_Z$ are X, Y, Z direction components of the magnetization of the S spin system; $\gamma_I$, $\gamma_S$ are gyro-magnetic ratios of the spin systems I and S; $J_0$ is the coupling constant between I spin system and S spin system; $\mathbf{I}$ is the vector of the spins I; $\mathbf{S}$ is the vector of the spins S.

$J_R$ can be calculated according to this equation. In the calculation, since rf field for decoupling is divided into pulses in the pulse decoupling method as shown in FIG. 2, $J_R$ must be first calculated at each pulse by dividing the time t into pulses; thereafter, $J_R$ can be averaged. Then $J_R/J_0$ should be obtained.

In FIG. 4, a solid line represents a result of the calculation according to the aforesaid process under appropriate conditions. From this figure, it is known that there are two peaks in the power distribution between zero off-set and 3 KHz off-set frequency, beyond which decoupling becomes progressively more incomplete.

SUMMARY OF THE PRESENT INVENTION

The present inventor has discovered that it is possible to further expand the range of complete decoupling by elimination of these peaks. And based on repeated experiments, the present inventor has discovered that it is highly effective for expanding the complete decoupling range to combine the aforementioned pulse decoupling method with the square wave modulation method, namely, to reverse the phase (to shift 180° in phase) of rf carrier cyclically at a period longer than that of repetition of the pulse train. In addition, the pulse train is not necessarily limited to what has been proposed by Freeman and many kinds of pulse trains can be contrived. The results of calculations according to the present invention are shown in FIG. 4 by a broken line, wherein the abovementioned two peaks are eliminated and the line extends to roughly 4 KHz. This calculation may be made in the same manner as the preceding one. However, since the phase is reversed at a period longer than the repetitive period of the pulse train, it should be taken into consideration that the phase of the rf carrier is turned by 180° (the sign of suffix is reversed) in the middle of the pulse train.

Accordingly, the object of the present invention is to provide a method and apparatus for performing wide band decoupling.

It is a feature of this invention to combine the pulse decoupling method with the square wave phase-modulation method.

It is another feature of this invention to reverse the phase of radiofrequency carrier cyclically in a period longer than that of repetition of the pulse train.

It is another feature of this invention to adopt various kinds of pulse trains for controlling the decoupling bandwidth.

DETAILED DESCRIPTION OF THE PRESENT INVENTION

Figure 5:
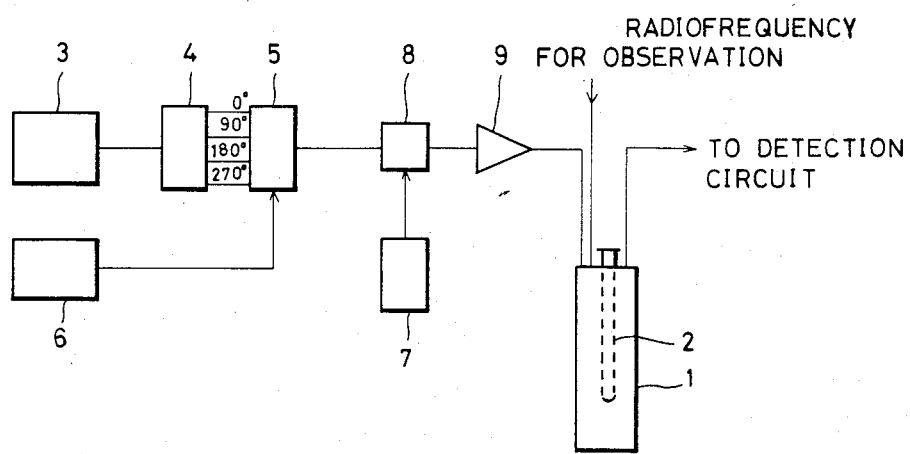
FIG. 5 is a block diagram of a nuclear magnetic resonance spectrometer incorporating features of the present invention.

Referring now to FIG. 5, an NMR probe 1 is arranged in a polarizing magnetic field. Rf carrier for decoupling generated from rf oscillator 3 is transmitted to a specimen 2 at the probe 1 together with another rf for observation, and the free induction decay (FID) detected at the probe 1 is applied to a detection circuit (not shown) and processed therein. The rf carrier for decoupling is provided with four different phases at a four-phase circuit 4, namely, 0°, 90°, 180° and 270° phases and subsequently sent to a selective circuit 5. According to command signals from pulse programmer 6, the selective circuit 5 selects the rf carrier with the desired phase for the desired duration of time and produces pulse trains. The pulse trains are phase modulated at a modulator 8 to which a square wave signal is supplied from a square wave oscillator 7. The output of modulator 8 is supplied to the probe 1 through a power amplifier 9 and transmitted to the specimen.

In the above described apparatus, the pulse programmer 6 already has the information regarding the phase and pulse width for all rf pulses contained in the pulse train, in the order of irradiation. For example, in the case of the pulse train shown in FIG. 2, each rf pulse is converted to the information of the phase of rf carrier and pulse width as follows:

the first 90°$_x$ pulse: (phase, pulse width)=(0°, t$_1$), next 240°$_y$ pulse: (90°, t$_2$), ———, where, t$_1$ represents the pulse width for 90° pulses and t$_2$ represents the pulse width for 240° pulses.

Accordingly, an operator can prepare any kind of pulses having arbitrary pulse width and can also specify the phase of the rf carrier at 0°, 90°, 180°, or 270°; therefore, he can prepare any kind of pulse train by joining any number and any kind of pulses.

Figure 1:
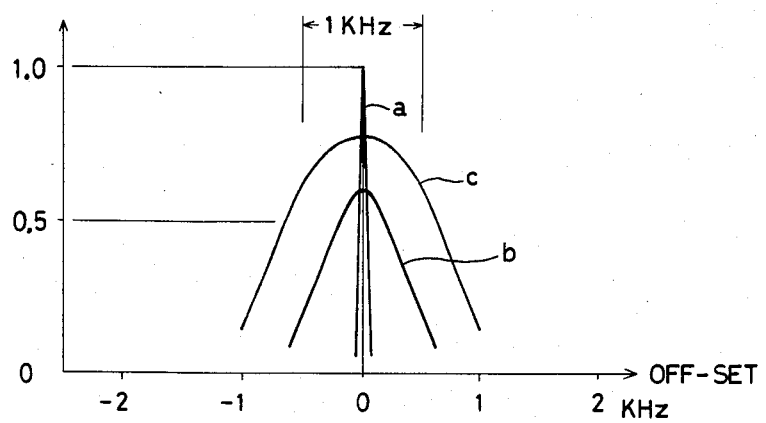
FIG. 1 shows the bandwidth according to the prior art.
Figure 2:
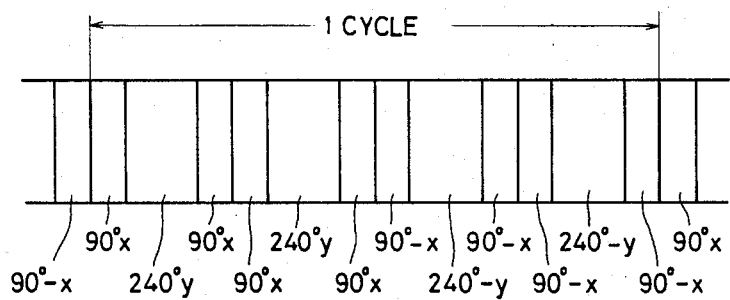
FIG. 2 shows the arrangement of radiofrequency pulses in the pulse train proposed by Freeman.
Figure 3:
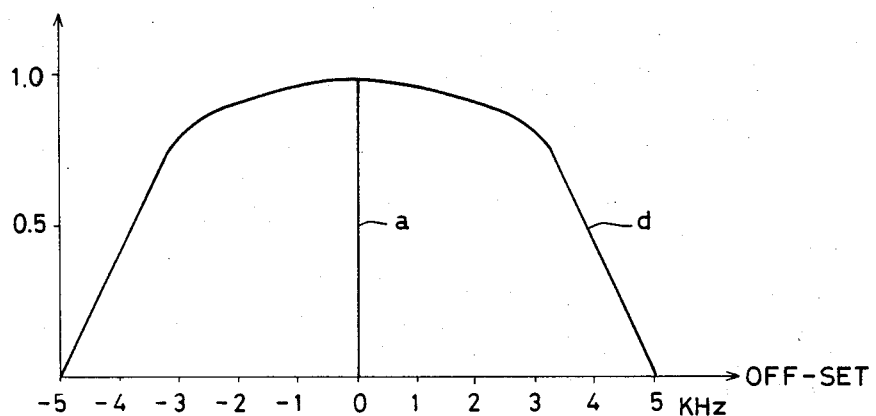
FIG. 3 shows the bandwidth according to the pulse decoupling method proposed by Freeman.
Figure 4:
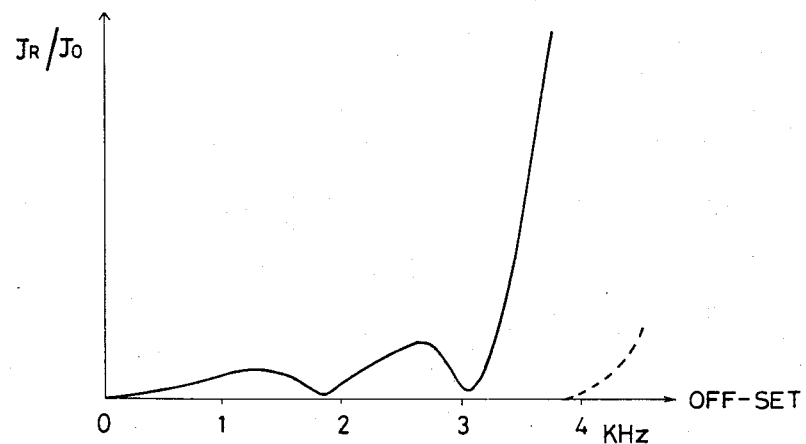
FIG. 4 comprises plots showing $J_R/J_0$ versus off-set frequency on the pulse decoupling method proposed by Freeman and on the method of the present invention.
Figure 6:
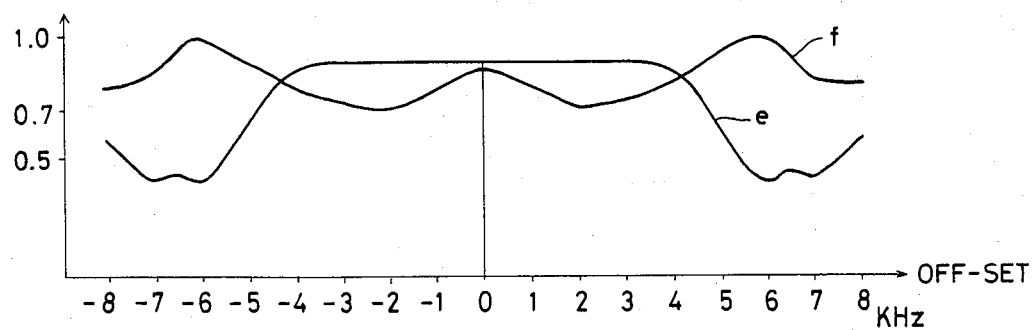
FIG. 6 shows the measured bandwidths according to the present invention.

In FIG. 6, solid line (e) shows the bandwidth under the condition that the pulse train shown in FIG. 2 applied repeatedly and phase-modulated asynchronously with a square wave of 100 Hz, chosen here to be a longer period than that of the pulse train. It is obvious from this figure, that by adding the square wave phase-modulation, the bandwidth of rf field for decoupling is expanded from 8 KHz in FIG. 3 to 11 KHz in FIG. 6 by comparison at the level of 0.5 on the axis of ordinates.

Furthermore, the present inventor has applied a variety of other pulse trains with the square wave phase-modulation. In FIG. 6, solid line (f) shows the bandwidth obtained by the pulse train shown in FIG. 7. It is obvious from this figure that the bandwidth spreads over 16 KHz.

Figure 7:
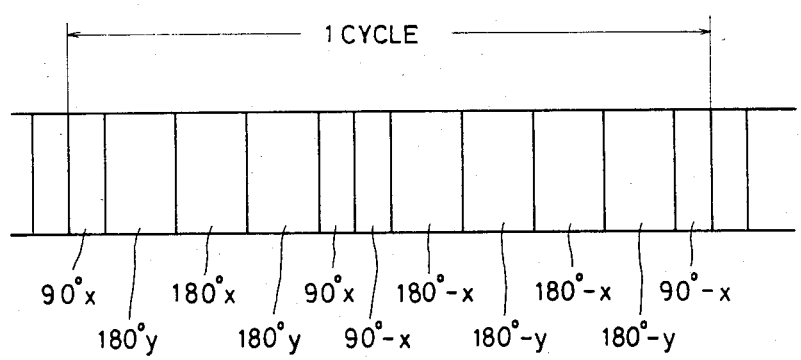
FIG. 7 shows the arrangement of radiofrequency pulses in an alternative pulse train.

According to the experiments using a variety of pulse trains including the pulse trains shown in FIG. 2 and FIG. 7, it has been found out that any pulse train in which at least either of two unit pulse trains $R_{+1}$ and $R_{+1'}$ and either of two unit pulse trains $R_{-1}$ and $R_{-1'}$, are contained, can be used. Here, $R_{+1}$ represents a unit pulse train in which A°$_x$ pulse, B°$_y$ pulse and A°$_x$ pulse are combined in this order, $R_{-1}$ represents a unit pulse train in which A°$_{-x}$ pulse, B°$_{-y}$ pulse and A°$_{-x}$ pulse are combined in this order, $R_{+1'}$ represents a unit pulse train in which A°$_x$ pulse and B°$_y$ pulse are combined in this order and $R_{-1'}$ represents a unit pulse train in which A°$_{-x}$ pulse and B°$_{-y}$ pulse are combined in this order.

As for the values of A and B of the A° pulse and B° pulse, A can be chosen ranging from about 90 to 45 and B can be chosen ranging from 240 to 90. Furthermore, the other some pulse, C° pulse having a different pulse width from the A° pulse and B° pulse can be optionally combined in the sequence. By varying the values of A and B, and the combination of unit pulse trains, the bandwidth can be freely chosen.

As described above, the range of decoupling can be expanded according to the present invention. Therefore, the following excellent effects can be obtained: (1) nuclear species with large chemical shifts such as $^{19}F$ are easily decoupled, (2) wide range decoupling can be worked out in NMR spectrometers with resonant frequency of 400 MHz or higher, (3) since wide range decoupling is possible with low decoupling power, the construction of power amplifiers and the related circuits can be simplified, (4) a field of applications is expanded, because samples which could not be measured on account of intolerable heating by decoupling power can be measured, (5) not only the signal to noise ratio but also quantification are improved because broadband and uniform decoupling can be worked out according to the present invention.

Numerous variations on the above described method and apparatus will occur to one skilled in the art. For example, the modulator 8 may be arranged between the oscillator 3 and the four-phase circuit 4 to modulate rf carrier for decoupling.

Having thus described the invention with the detail and particularity required by the Patent Laws, what is desired protected by Letters Patent is set forth in the following claims:

1. A decoupling method for nuclear magnetic resonance spectroscopy comprising, repeatedly applying a pulse train to a sample for decoupling, said pulse train containing a series of radiofrequency pulses joined without interval, each radiofrequency pulse being phased at 0°, 90°, 180°, or 270°, and reversing the phase of the radiofrequency carrier of the pulse train at the interval longer than the repetitive cycle of the pulse train asynchronously with the repetition of application of the pulse train.

2. The method of claim 1 wherein said pulse train consists of at least two kinds of radiofrequency pulses of A° pulse and B° pulse.

3. The method of claim 2 wherein the value A of said A° pulse is chosen from 90 to 45 and the value B of said B° pulse is chosen from 240 to 90.

4. The method of claim 2 wherein said pulse train contains at least either of two unit pulse trains $R_{+1}$ and $R_{+1'}$ and either of two unit pulse trains $R_{-1}$ and $R_{-1'}$, where $R_{+1}$, $R_{+1'}$, $R_{-1}$, and $R_{-1'}$ are unit pulse trains consisting of radiofrequency pulses such that $$R_{+1} \longrightarrow A°_x \cdot B°_y \cdot A°_x$$

$$R_{+1'} \longrightarrow A°_x \cdot B°_y$$

$$R_{-1} \longrightarrow A°_{-x} \cdot B°_{-y} \cdot A°_{-x}$$

$$R_{-1'} \longrightarrow A°_{-x} \cdot B°_{-y}.$$

5. Nuclear magnetic resonance spectrometer employing means for applying a decoupling radiofrequency magnetic field to a sample said means including:

means for generating radiofrequency carrier for decoupling;

means for providing said radiofrequency carrier with 0°, 90°, 180°, and 270° phases;

means for producing a pulse train repeatedly, said pulse train containing a series of radiofrequency pulses joined without interval, said radiofrequency pulses having the predetermined phases and pulse widths and being arranged in predetermined order;

means for reversing the phase of the radiofrequency carrier of the pulse train at an interval longer than the repetitive cycle of the pulse train and asynchronously with the repetition of application of the pulse train.

* * * * *